(12) United States Patent
Nilsson

(10) Patent No.: US 8,338,957 B2
(45) Date of Patent: Dec. 25, 2012

(54) LOW RESISTANCE THROUGH-WAFER VIA

(75) Inventor: Peter Nilsson, Solna (SE)

(73) Assignee: ÅAC Microtec AB, Uppsala (SE)

( * ) Notice: Subject to any disclaimer, the term of this patent is extended or adjusted under 35 U.S.C. 154(b) by 331 days.

(21) Appl. No.: 12/452,468

(22) PCT Filed: Jun. 27, 2008

(86) PCT No.: PCT/SE2008/050794
§ 371 (c)(1),
(2), (4) Date: Dec. 31, 2009

(87) PCT Pub. No.: WO2009/005462
PCT Pub. Date: Jan. 8, 2009

(65) Prior Publication Data
US 2010/0133697 A1    Jun. 3, 2010

(30) Foreign Application Priority Data

Jul. 5, 2007    (SE) .................................... 0701657
Sep. 12, 2007    (SE) .................................... 0702047
Oct. 26, 2007    (SE) .................................... 0702403

(51) Int. Cl.
*H01L 23/48* (2006.01)
(52) U.S. Cl. ......... 257/774; 257/E21.597; 257/E23.174; 438/667
(58) Field of Classification Search .................. 257/774, 257/778, E23.174, 773, 775, E21.597; 438/667, 438/629, 637, 639, 640, 668, 672, 700, 713, 438/978
See application file for complete search history.

(56) References Cited

U.S. PATENT DOCUMENTS

| | | |
|---|---|---|
| 5,510,655 A | 4/1996 | Tanielian |
| 2002/0190015 A1 | 12/2002 | Dietrich |
| 2003/0137056 A1 | 7/2003 | Taniguchi et al. |
| 2006/0278997 A1* | 12/2006 | Gibson et al. .................. 257/778 |
| 2007/0052067 A1 | 3/2007 | Umemoto |

OTHER PUBLICATIONS

International Search Report mailed Oct. 10, 2008, in PCT/SE2008/050794, 3 pages.

* cited by examiner

*Primary Examiner* — Hoa B Trinh
(74) *Attorney, Agent, or Firm* — Foley & Lardner LLP

(57) ABSTRACT

The present invention provides a wafer (3) comprising a through-wafer via (7) through the wafer (3) formed by a through-wafer via hole (9) and at least a first conductive coating (25). A substantially vertical sidewall (11) of the through-wafer via hole (9) except for a constriction (23) provides a reliable through-wafer via (7) occupying a small area on the wafer. The wafer (3) is preferably made of a semiconductor material, such as silicon, or a glass ceramic. A method for manufacturing such a wafer (3) is described.

19 Claims, 13 Drawing Sheets

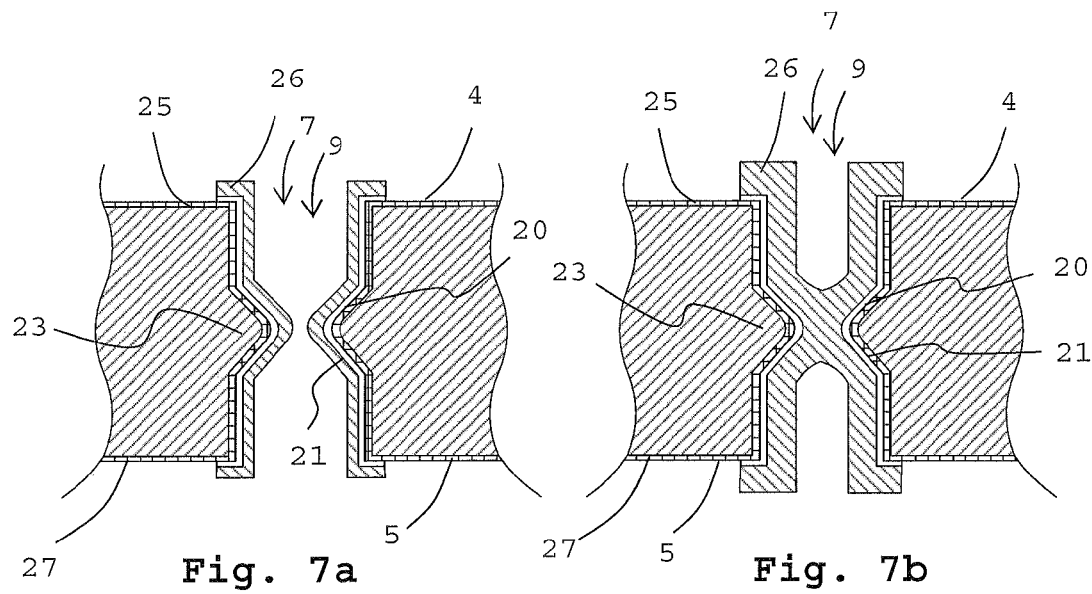
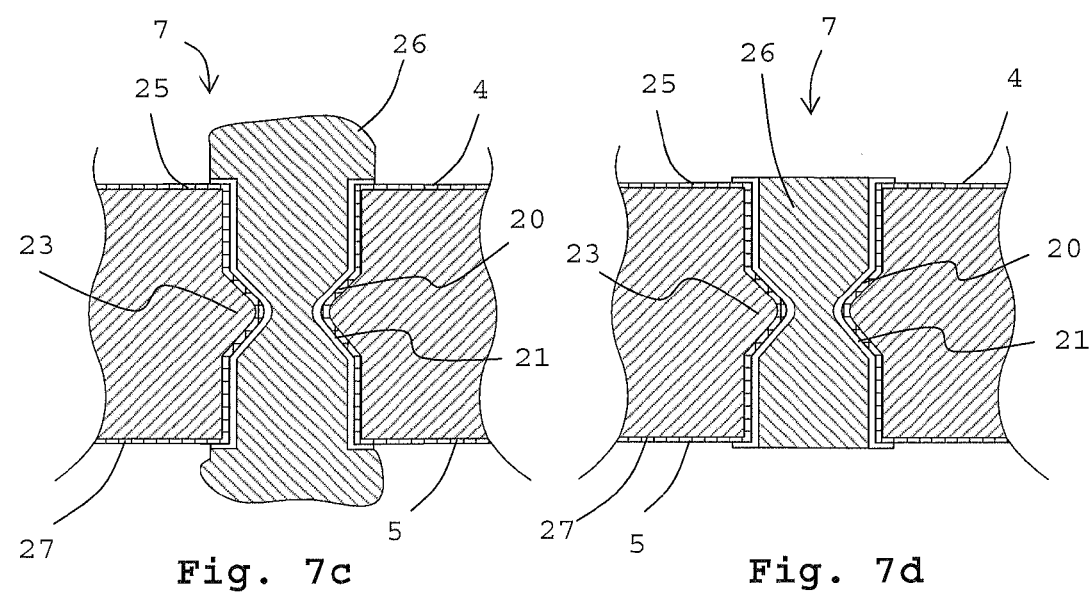

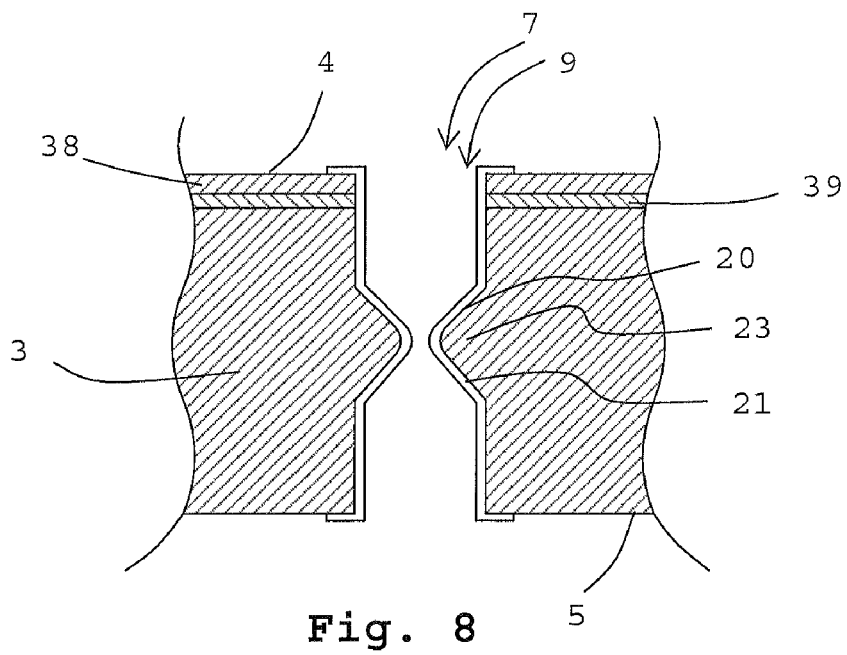
Fig. 8
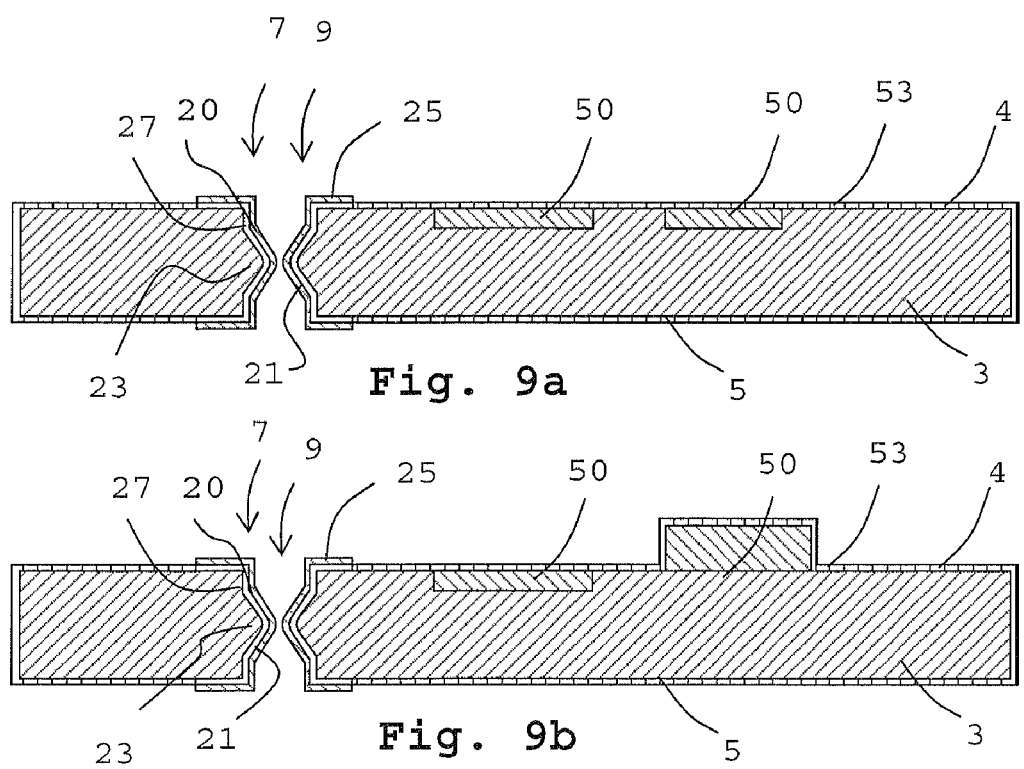
Fig. 9a
Fig. 9b

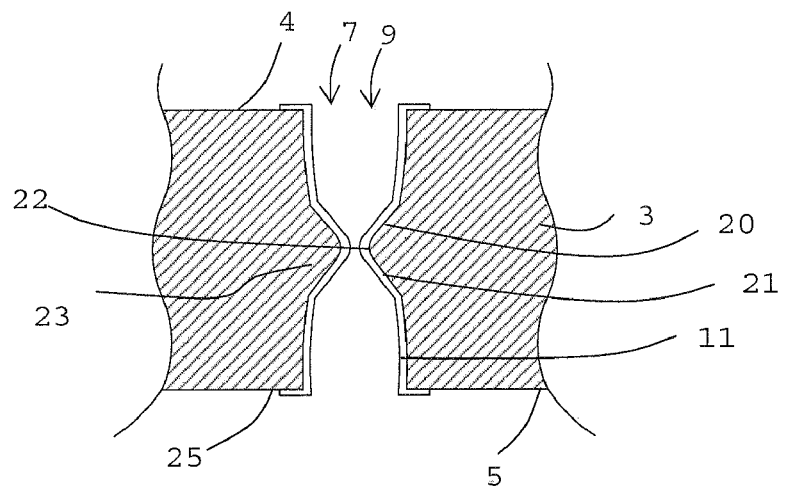
Fig. 10
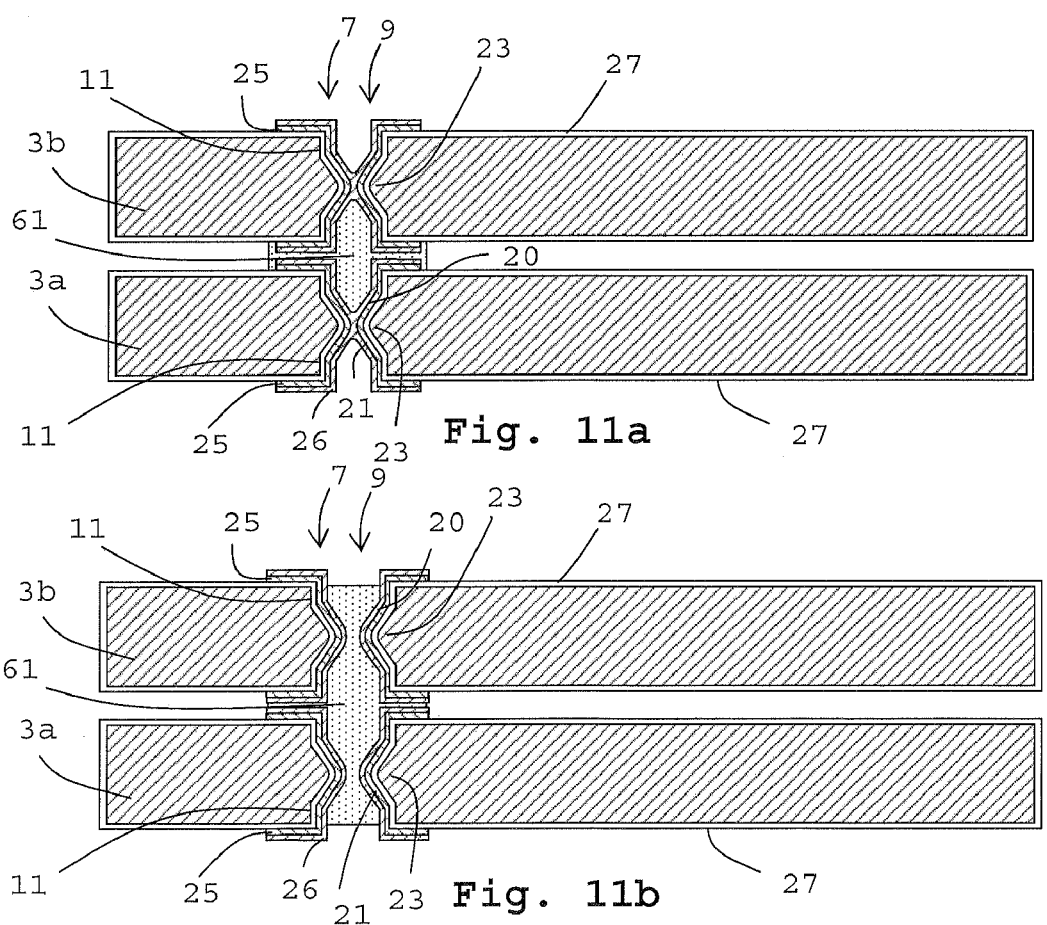
Fig. 11a
Fig. 11b

LOW RESISTANCE THROUGH-WAFER VIA

CROSS-REFERENCE TO RELATED APPLICATIONS

This application is a National Stage application of PCT/SE2008/050794, filed Jun. 27, 2008, which claims priority from Sweden applications SE 0701657-9 filed Jul. 5, 2007, SE 0702047-2 filed Sep. 12, 2007, and SE 0702403-7 filed Oct. 26, 2007.

TECHNICAL FIELD OF THE INVENTION

The present invention relates to electrically conductive connections through a wafer used for electronic devices, such as a silicon wafer or a glass wafer.

BACKGROUND OF THE INVENTION

In microelectronics integrated circuit device density is increasing at a high rate. In 1965 Moore's law predicted that the number of transistors per chip would double every 2 years, and the development of microelectronics has indeed roughly matched this prediction. However the implementation of further miniaturization of integrated circuits is costly and the ever more complex circuits require an increasing number of I/O leads, which complicates the contacting and packaging of the devices. Hence other means for getting higher device density are needed. An emerging alternative is to increase the device density per unit area by stacking devices on top of each other. Currently, stacked devices are mostly interconnected by wire bonding, which is a complex process that requires a large amount of space on the device and unnecessarily long connecting leads. Furthermore wire bonding commonly gives a fairly high resistance and can be unreliable.

A spin-off from microelectronics are microelectromechanical systems (MEMS), wherein the functionality of the microelectronic systems or technologies can be enhanced. In MEMS, integrated circuits are integrated with e.g. mechanical, chemical, biological functions, or, based on the vast knowledge of microelectronic processing, microelectromechanical systems such as accelerometers, sensors, or biochips are manufactured. Many of these microelectromechanical systems extended in all 3 dimensions in order to obtain the desired functionalities.

As in microelectronics, MEMS structures are mainly fabricated using silicon wafers as substrates, but e.g. other semiconducting materials, polymers, ceramics and glass are becoming more widely used. Accompanying the increasing interest in making 3D microelectronic and MEMS structures there is an increasing interest in making electrical interconnects between the front side and the back side of the substrates or wafers of the 3D structure, i.e. so called "through-wafer vias". Using these, unreliable and costly wire bonding is avoided and the interconnect density can be increased. The through-wafer vias should occupy as small area as possible on the wafers and the resistance of the electrical interconnects should be low. Furthermore the processing of the through wafer vias should be compatible with conventional processing technologies in the field.

Different through-wafer via designs have been disclosed, and the strategy for making the via can be divided into two categories. In the first category the through-wafer vias are formed by the wafer material, e.g. a doped semiconductor via. In the second category a through-wafer via hole is formed in the wafer using for example laser ablation, drilling, wet etching or dry etching. Thereafter a conductive material is deposited, e.g. using a physical vapour deposition (PVD) process, on at least the sidewalls of the through-wafer via hole. To increase the cross sectional area of the conductive through-wafer via (in order to reduce the electrical resistance) a metal or metal alloy is commonly plated onto the conductive coating. Through-wafer vias of the first category generally have a relatively high resistance as compared to through-wafer vias of the second category due to the higher conductivity of the metal or metal alloy.

The technique used for the formation of the via hole mainly depends on the wafer material. However, in general the via holes extend through the wafer with vertical sidewalls. The deposition of a conductive material on the sidewalls using a line-of-sight process such as PVD is a challenging operation, particularly for holes with a high aspect ratio, since there is a shadowing effect from the edges of the via hole.

Conventional low resistance through-wafer vias in silicon are typically formed by using either wet etch processing or dry etch processing to form the via hole. Anisotropic etch processes such as KOH-etching, which is a wet etching process, or deep reactive ion etching (DRIE), which is a dry etching process, are commonly used. Using anisotropic wet etching the geometry of the via hole is restricted by the crystal planes of the wafer material and the via holes consequently occupy a relatively large area. The area can be somewhat reduced by etching from both sides of the wafer, wherein the etched recesses meet in-between the sides. However, when etched recesses meet at the opening of the via hole, other crystal planes are formed. These crystal planes are then etched and may generate areas in the middle portion of the via holes that are not in-line of sight from the opening of the via hole, i.e. these areas are shaded and can not be coated using a physical vapour deposition process. Physical vapour deposition is a line-of-sight process and only surfaces in line-of-sight from the evaporation/sputtering source will be coated. DRIE is advantageous since a via hole with vertical walls, and hence occupying a smaller area, is possible. These via holes with vertical via holes do not suffer from the shadow effect described above, but there still will be a shadowing effect due to the vertical walls, particularly for narrow and deep via holes.

Accordingly conventional low resistance through-wafer vias are formed in through wafer via holes that suffer from an incomplete coverage of the via hole by the conductive material. This limits the reliability of DRIE etched through-wafer vias, particularly for narrow vias made in thick substrates.

SUMMARY OF THE INVENTION

The prior art has drawbacks with regards to being able to provide reliable, low resistance through-wafer vias, particularly due to the shortcomings in forming a through-wafer via hole with a proper geometry.

The object of the present invention is to overcome the drawbacks of the prior art. This is achieved by the wafer and the method as defined in the independent claims.

In a first aspect the present invention provides a wafer having an upper side and a lower side and comprising at least one through-wafer via hole having a sidewall. The sidewall of the through-wafer via hole is coated with a first conductive coating forming a through-wafer via from the upper side to the lower side. Furthermore, the sidewall comprises at least a first portion with a substantially vertical sidewall and a second portion forming a constriction in the through wafer via hole. The constriction comprises at least an upper sloping sidewall widening out towards the opening in the upper side.

In one embodiment of the present invention a through-wafer via hole comprises a third portion with a substantially vertical sidewall positioned in such way that the second portion is located between the first and the third portions. The constriction may further comprise a lower sloping sidewall widening out towards the lower side.

In one embodiment a wafer comprises a plurality of through-wafer vias, whereof at least one through-wafer via is sealed and at least one through-wafer via is open. A further embodiment of the invention comprises an electric device which comprises a plurality of through-wafer vias, all of which are sealed. Another embodiment of the invention comprises a wafer which comprises a plurality of through-wafer vias, all of which are open.

One embodiment of the present invention comprises an electronic device comprising a wafer having through-wafer vias in accordance with the invention.

In a second aspect the present invention provides a method for manufacturing a wafer according to the present invention. The method comprises the steps of: defining at least one first sloping wall in the wafer, the first sloping wall determining the shape of the upper sloping wall of the constriction; forming the through-wafer via hole by anisotropic etching, wherein the upper sloping sidewall of the constriction replicates the first sloping sidewall; and depositing the first conductive coating on the sidewall of the through-wafer via hole.

In one embodiment of the method in accordance with the present invention the step of defining comprises the step of forming at least one first recess with a first sloping wall on the upper side of the wafer by etching and optionally forming at least one second recess with a second sloping sidewall on the lower side of the wafer by etching, the second sloping wall determining the shape of a lower sloping wall of the constriction widening out towards the lower side.

Thanks to the invention it is possible to provide a high yield, reliable, through-wafer via using processes compatible with conventional processing technologies in the field of microelectronics, MEMS and nanotechnology. Furthermore the method is simple and requiring a minimum of masking steps.

Thanks to the invention it is possible to provide through-wafer vias in prefabricated electronic devices comprising e.g. integrated components, such as microelectronic components, integrated circuits, MEMS structures and nanostructures, integrated in the wafer surface, e.g. CMOS circuits, or arranged on the wafer surface, e.g. memory components, processors, FPGAs, ASICs, actuators, sensors, microstructures or nanostructures.

It is a further advantage of the invention to provide a plated through-wafer via which can be selected to be open or closed, i.e. a hermetically sealed through-wafer via is possible.

It is a yet further advantage that the constriction of the through-wafer via provides an improved adhesion of the conductive material and gives a mechanical support to the conductive material, improving the robustness and the reliability of the device.

In addition, the constriction gives improved thermal properties. The improved adhesion of the conductive material to the sidewalls of the through-wafer via improves the lateral thermal conductivity and thus improves lateral cooling of the through-wafer via. Furthermore liquid cooling, using cooling liquid flow through an open through-wafer via, is improved due to increased flow velocity at the constriction.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 8 is a schematic illustration of a SOI wafer comprising a through wafer via according to the invention;

FIG. 9a is a schematic illustration of an electronic device comprising an integrated circuit and a through-wafer via according to the invention;

FIG. 9b is a schematic illustration of an electronic device comprising an integrated circuit integrated in the wafer surface, a microelectronic component arranged on the wafer surface and a through-wafer via according to the present invention;

FIG. 10 is a schematic illustration of a glass ceramic wafer with comprising a sealed low resistance through wafer via according to the invention;

FIG. 11a and FIG. 11b are schematic illustrations of an electronic device comprising two stacked wafers, each comprising a through-wafer via, wherein the wafers are connected by the vias according to the present invention;

DETAILED DESCRIPTION OF EMBODIMENTS

Figure 1:
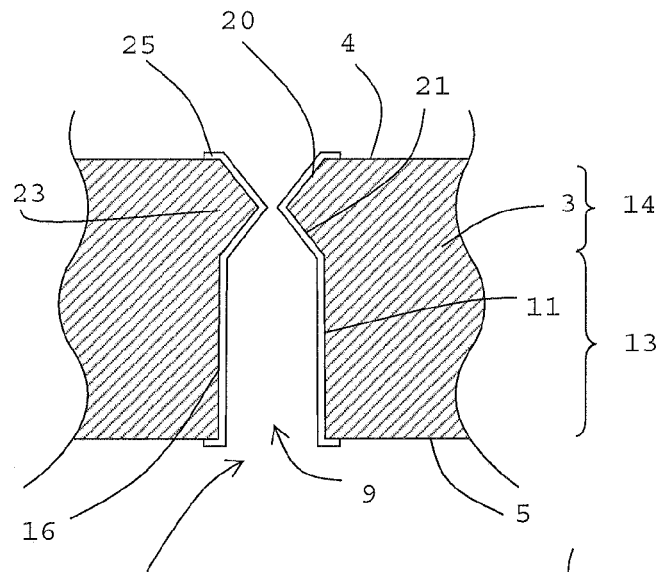
FIG. 1 is a schematic illustration of one embodiment of a through wafer via according to the invention.

For the purpose of this application the term "electronic device" refers to microelectronic devices, electronic MEMS devices, electronic nanotechnology devices, as well as simpler electronic devices. A microelectronic device may comprise microelectronic components such as integrated circuits integrated in the wafer surface or arranged on the surface of the wafer. A MEMS device may be formed by micromachining of e.g. a semiconductor wafer or surface micromachining on a wafer. The simpler electronic device may be a substrate used as a carrier for electronic components or an intermediate layer between other electronic devices. The term "wafer" originates from the fact the electronic devices such as integrated circuits and mostly also MEMS structures are made from silicon wafers. However the term wafer is not limited to silicon wafers or circular substrates, which is the typical shape of silicon wafers, but refers to all substrates suitable for use in electronic devices.

The dimensions of the wafers in the drawings are not necessarily to scale. Generally the lateral dimensions are exaggerated for the sake of clarity.

The basis of the present invention is a combination of a shape defining step and an subsequent anisotropic etch process to form a constriction in a through-wafer via hole, which enables more reliable manufacturing and operation of electronic devices comprising the wafer having through-wafer vias according to the present invention.

FIG. 1 schematically illustrates one embodiment of a wafer according to the present invention. The wafer 3 has an upper side 4 and a lower side 5 and comprises at least one through-wafer via hole 9 having a sidewall 11. The sidewall 11 of the through-wafer via hole 9 is coated with a first conductive coating 25 forming a through-wafer via 7 from the upper side 4 to the lower side 5. Furthermore, the through-wafer via hole 9 comprises a first portion 13 with a substantially vertical sidewall 16 and a second portion 14 forming a constriction 23 bulging out into the through wafer via hole 9. As can be observed in FIG. 1, the constriction 23 comprises an upper sloping sidewall 20 widening out up towards the upper side 4 and a lower sloping sidewall 21 widening out down towards lower side 5.

Figure 2:
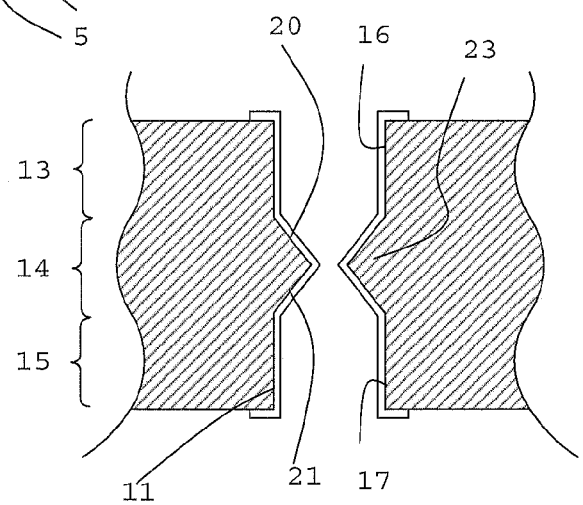
FIG. 2 is a schematic illustration of another embodiment of a through wafer via according to the invention.

FIG. 2 schematically illustrates one embodiment of a wafer 3 according to the present invention. The wafer 3 has an upper side 4 and a lower side 5 and at least one through-wafer via hole 9 having a sidewall 11 that is coated with a first conductive coating 25 forming a through-wafer via 7 from the upper side 4 to the lower side 5. Furthermore, the through-wafer via hole 9 comprises a first portion 13 with a substantially vertical sidewall 16, a second portion 14 forming a constriction 23 bulging out in the through wafer via hole 9, and a third portion 15 with a substantially vertical sidewall 17. As can be observed in FIG. 2, the constriction 23 comprises an upper sloping sidewall 20 widening out towards the upper side and a lower sloping sidewall 21 widening out towards lower side 5.

In one embodiment of the present invention the wafer 3 of the embodiments described above, which refers to FIGS. 1 and 2, is made of a semiconductor material. Preferably, the semiconductor material is single crystalline silicon. One alternative is so called "silicon-on-insulator (SOI) wafers", which comprises e.g. a silicon oxide layer between a bulk layer and a device layer. Other semiconductor materials are feasible, such as SiC and GaAs, however the invention is not limited to these. For semiconductor materials the sloping sidewalls (20, 21) illustrated in FIGS. 1 and 2 are inclined planar surfaces, typically following the crystal planes of the semiconductor wafer.

The present invention is not limited to silicon or other semiconductor materials. In another embodiment of the present invention the wafer 3 is made from a photosensitive starting material such as a photosensitive glass or glass ceramic, or a photosensitive polymer. Photosensitive glasses or glass ceramics, such as e.g. Foturan® (by Schott), are structured by exposing a portion of the wafer that is to be removed to light of a certain wavelength, heat treating the wafer and then etching away the portion to be removed. The final material combines the unique properties of glass (transparency, hardness, chemical and thermal resistance, etc.) with the possibility of obtaining fine structures with tight tolerances and high aspect ratios. If a focused light beam, such as a laser beam, is used three dimensional structures can be accomplished. Photosensitive polymers can be processed in a similar way to glass ceramics. The portion to be removed is protected from the light of a certain wavelength, whereas the rest of the wafer is exposed. Thereby exposed portion is polymerized and the portion to be removed can be dissolved using a solvent.

In yet another embodiment of the present invention the wafer 3 is made of a printed circuit board (PCB), a flexible printed circuit board (FPC) or the like. In these cases the through-wafer via holes 9 according to the present invention are typically formed by drilling, laser ablation, dry etching or stamping.

Figure 3:
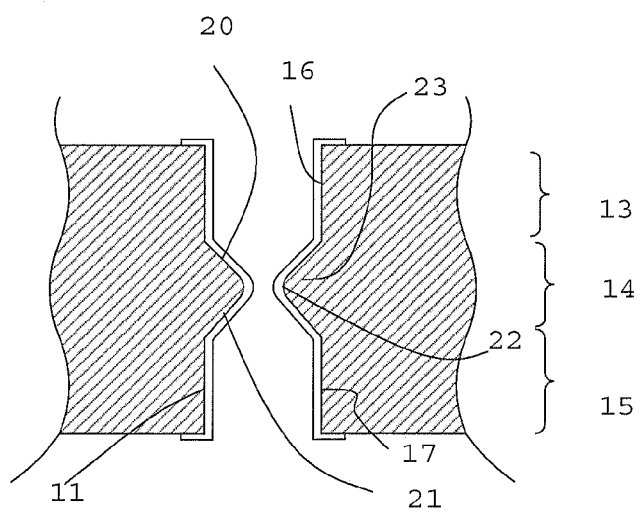
FIG. 3 is a schematic illustration of one embodiment of a through wafer via having a rounded constriction according to the invention.

FIG. 3 schematically illustrates one embodiment of a wafer comprising a through-wafer via, which is a variant of the through wafer via illustrated in FIG. 2. The constriction 23, which has an upper sloping sidewall 20 widening out towards the upper side and a lower sloping sidewall 21 widening out towards the lower side, is smoothly rounded at the intersection 22 of the sloping sidewalls 20, 21.

The design of the through-wafer via hole 9 according to the present invention is advantageous when coating the sidewall 11. In a conventional via hole with vertical sidewalls extending through the whole wafer the coverage in the middle of the via hole may be insufficient when a line-of-sight process such as physical vapour deposition is used for deposition of the sidewall coating. The sloping walls 20, 21 of the constriction 23 is in-line-of-sight for a deposition source placed in front of the upper side 4 and the lower side 5, respectively. Consequently the sloping walls 20, 21 are coated in a reliable way. In addition a smoothly rounded constriction 23 as schematically illustrated in FIG. 3 prevents sharp turns in the conductive path through the through-wafer via 7. Accordingly a through wafer via according to the present invention provides electrical and mechanical advantages compared with a prior art via, which can be exemplified by an improved yield in processing and improved electrical properties, in particular in RF applications.

FIGS. 4a-f schematically illustrates, by way of example, alternative embodiments of the present invention, however the invention is not limited to these. These alternative embodiments are generally illustrated with a pointed intersection 22 between the upper and lower sloping sidewalls 20, 21 of the constriction 23. However a pointed intersection is not necessary and any degree of rounding of the intersection is possible.

Figure 4A:
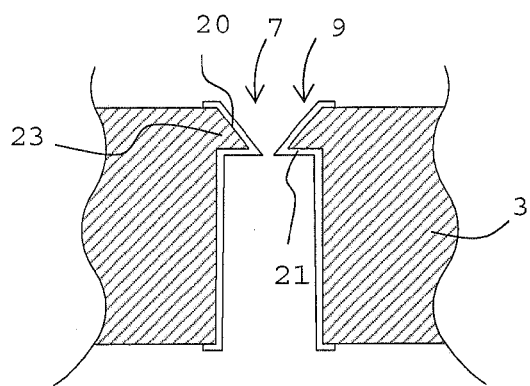
FIGS. 4a-4f are different embodiments of a through wafer via according to the invention.

Referring to FIG. 4a, one embodiment of the present invention is a wafer 3 having an upper side 4 and a lower side 5 and comprising at least one through-wafer via hole 9 having a sidewall 11. The sidewall 11 of the through-wafer via hole 9 is coated with a first conductive coating 25 forming a through-wafer via 7 from the upper side 4 to the lower side 5. Furthermore, the through-wafer via hole 9 comprises a first portion 13 with a substantially vertical sidewall 16 and a second portion 14 forming a constriction 23 bulging out in the through wafer via hole 9 adjacent to the upper side 4. The constriction 23 comprises an upper sloping sidewall 20 widening out towards the upper side and a lower sloping sidewall 21, which is horizontal or slopes at a shallow angle (less than 10° or less than)5° on the lower side.

Figure 4B:
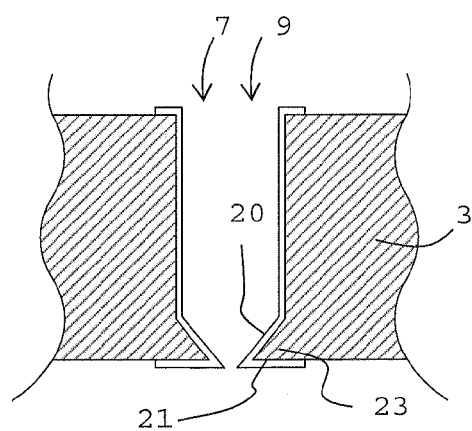

Referring to FIG. 4b, one embodiment of the present invention comprises a through-wafer via hole 9, wherein the first portion 13 is adjacent to the upper side 4 and the constriction 23 is adjacent to the lower side 5. The constriction 23 comprises an upper sloping sidewall 20 widening out towards the upper side and a lower sidewall 21, which is horizontal or slopes at a shallow angle (less than 10° or less than 5°), on the lower side.

Figure 4C:
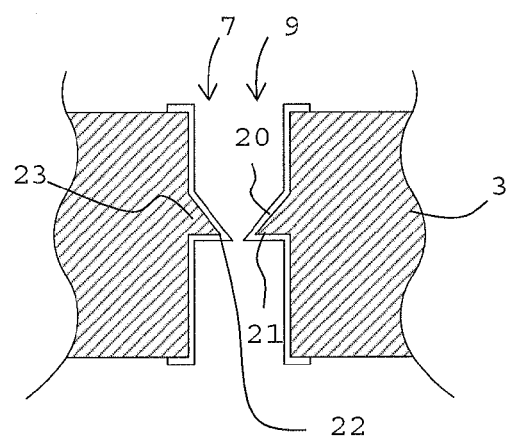
Figure 4D:
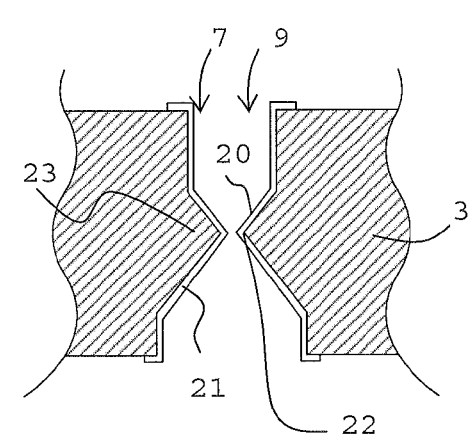

Referring to FIG. 4c, one embodiment of the present invention comprises a through wafer via hole 9, wherein the second portion 14 comprising the constriction 23 is placed in the middle of the through-wafer via hole 9 between the first and third portion 13, 15 having substantially vertical sidewalls 16, 17. The constriction 23 comprises an upper sloping sidewall 20 widening out towards the upper side and a lower sloping sidewall 21, which is essentially horizontal. Although the portions 13, 14, 15 with vertical sidewalls in the embodiments illustrated in FIGS. 1-3 have the same dimensions on the upper side and lower sides 4, 5, the dimensions may be different. FIG. 4d illustrates one embodiment wherein the first portion 13 and the third portion 15 have different widths, resulting in an asymmetric constriction 23, wherein the lower sloping sidewall 21 has a larger surface than the upper sloping sidewall 20. Moreover said vertical sidewalls 16, 17 may be slightly inclined or tapered. However, any inclination of the sidewall increases the footprint of the via hole. The inclination can be accomplished by using different methods for forming the through-wafer via hole. For example a dry etch process can provide sloping or tapered sidewalls in a through-wafer via hole.

Figure 4E:
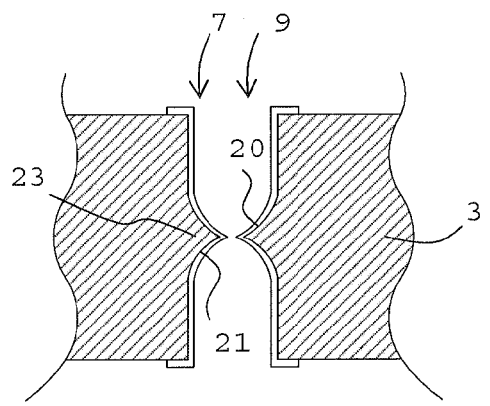
Figure 4F:
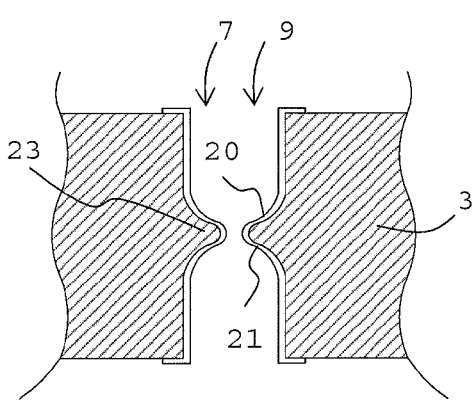

FIGS. 4e-f illustrates embodiments of the present invention, wherein the upper and lower sloping sidewalls 20, 21 are concavely curved. FIG. 4e illustrates one embodiment wherein the intersection 22 between the upper and lower sloping sidewalls 20, 21 of the constriction 23 forms a point. In analogy with the description of the rounded constriction 23 in FIG. 3, the embodiment illustrated in FIG. 4f has a rounded, i.e. convexly curved, intersection 22 between the upper and lower sloping sidewalls 20, 21 of the constriction 23.

Figure 5:
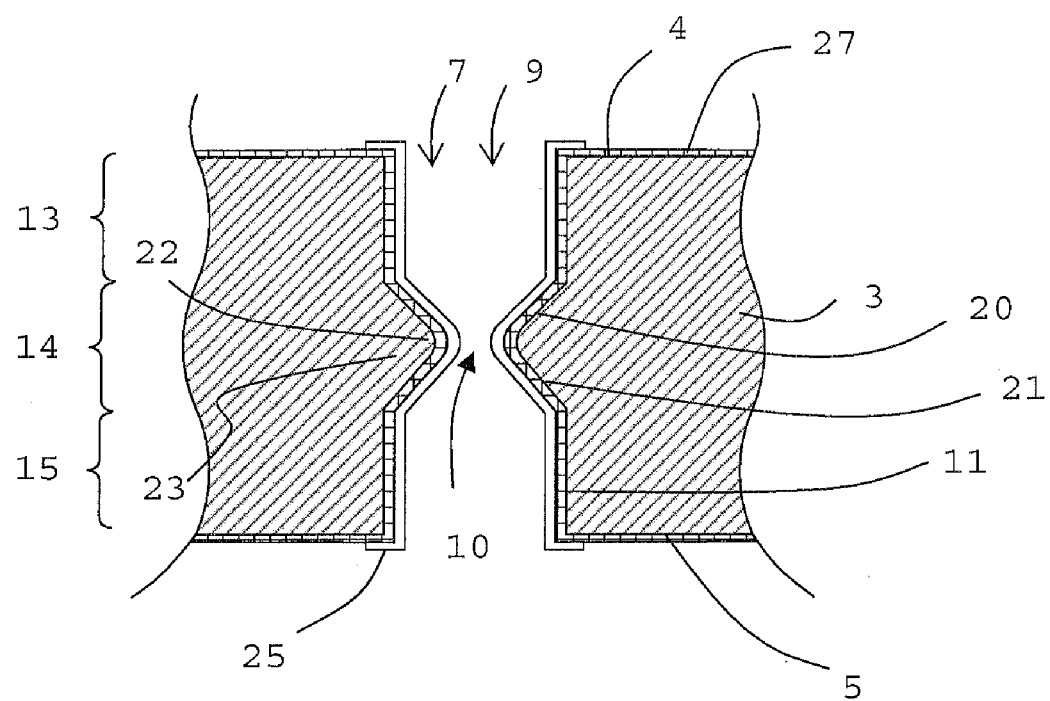
FIG. 5 is a schematic illustration of one embodiment of a through wafer via comprising an insulating layer according to the invention.

FIG. 5 schematically illustrates one embodiment of the present invention wherein at least a portion of the upper and lower sides 4, 5 of the wafer 3 and the sidewall 11 is covered by a continuous insulating layer 27 to provide electrical insulation between the first conductive coating 25 and the wafer 3. For example a semiconductor wafer 3 that may be made of silicon may be treated so that it becomes conductive, because of this it can be necessary to electrically insulate the via 7 in order to avoid cross-talk and short-circuiting between different components of the device 1. In this embodiment an open passage 10 is left in the middle of the through-wafer via hole 9.

Figure 6:
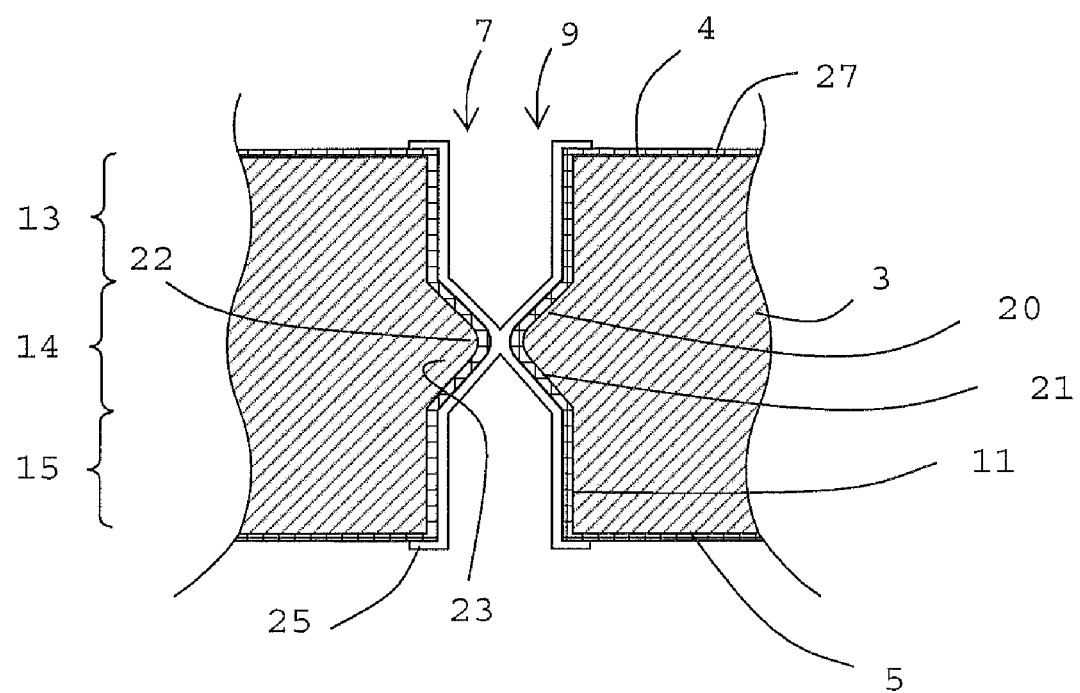
FIG. 6 is a schematic illustration of one embodiment of a sealed through wafer via according to the invention.

FIG. 6 schematically illustrates another embodiment of the present invention wherein the through-wafer via 9 is so narrow that the first conductive coating 25 bridges the opening within the constriction 23 and thereby seals the through-wafer via hole.

Preferably the lateral size of through-wafer via holes 9 according to the present invention is in the range of 50-500 µm, more preferably in the range of 100-200 µm. The actual size of a through-wafer via hole depends on the thickness of the wafer 3, the wafer material and the processing method. A 100-150 µm wide via is typical for a 300 µm thick silicon wafer, and a 150-200 µm wide via is typical for a 500 µm thick silicon wafer, i.e. the width of a through-wafer via hole 9 in a silicon wafer according to the invention is preferably from ⅓ up to ½ of the thickness of the silicon wafer 3.

FIG. 7a schematically illustrates one example of a silicon wafer 3 in accordance with the present invention. The silicon wafer 3 has an upper side 4 and a lower side 5 and comprises at least one through-wafer via hole 9 having a sidewall 11. At least a part of the upper and lower sides 4, 5 of the wafer 3 and the sidewall 11 may be covered by a continuous insulating layer 27 made of silicon oxide. The sidewall 11 of the through-wafer via hole 9 is preferably coated with a first conductive coating 25 made of e.g. Ti/Cu, forming a through-wafer via 7 from the upper side 4 to the lower side 5. The through-wafer via hole 9 comprises a first portion 13 with a substantially vertical sidewall 16, a second portion 14 forming a constriction 23 bulging out in the through wafer via hole 9, and a third portion 15 with a substantially vertical sidewall 17. As can be observed in FIG. 7a, the constriction 23 comprises an upper sloping sidewall 20 widening out towards the upper side and a lower sloping sidewall 21 widening out towards the lower side. Moreover, the constriction 23, which has an upper sloping sidewall 20 widening out towards the upper side and a lower sloping sidewall 21 widening out towards the lower side, is smoothly rounded at the intersection 22 of the sloping sidewalls 20, 21. A second conductive coating 26 made of e.g. Cu covers the first conductive coating 25. In this embodiment, the thickness of the second coating 26 is thicker than the first coating but this is not obligatory, and the through-wafer via hole 9 is left open.

In FIG. 7b another embodiment of the present invention is schematically illustrated, wherein the first conductive coating 25 and the second conductive coating 26 are thick enough to close the through-wafer via 9.

In FIG. 7c yet another embodiment is schematically illustrated. The second conductive coating 26, which for example is plated onto the first conductive coating, fills the through-wafer via hole 9 and protrudes out on at least the upper side 4 of the wafer 3.

FIG. 7d illustrates one embodiment through-wafer via 7 of the present invention which has been filled according to e.g. FIG. 7c and then subsequently planarised using e.g. grinding, polishing, etc.

Figure 7E:
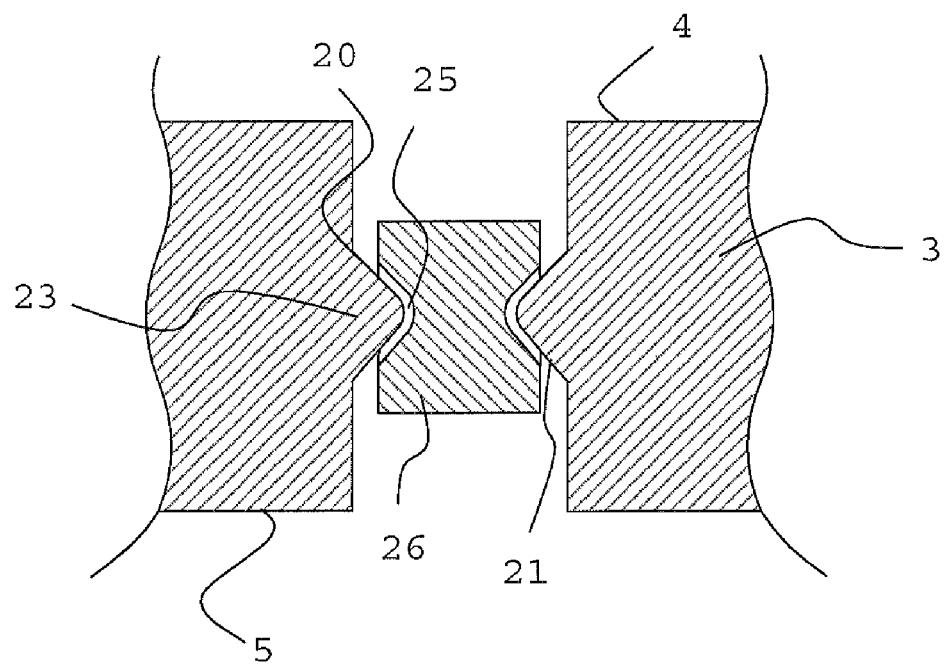
FIGS. 7a and 7b are illustrations of a sealed and a open through wafer via according to the invention, respectively, both having a second conductive coating.
FIG. 7c is a schematic illustration of a through-wafer via having a conductive coating that fills the via hole and protrudes outside the via hole.
FIG. 7d is a schematic illustration of the via of FIG. 7c after polishing.
Figure 7F:
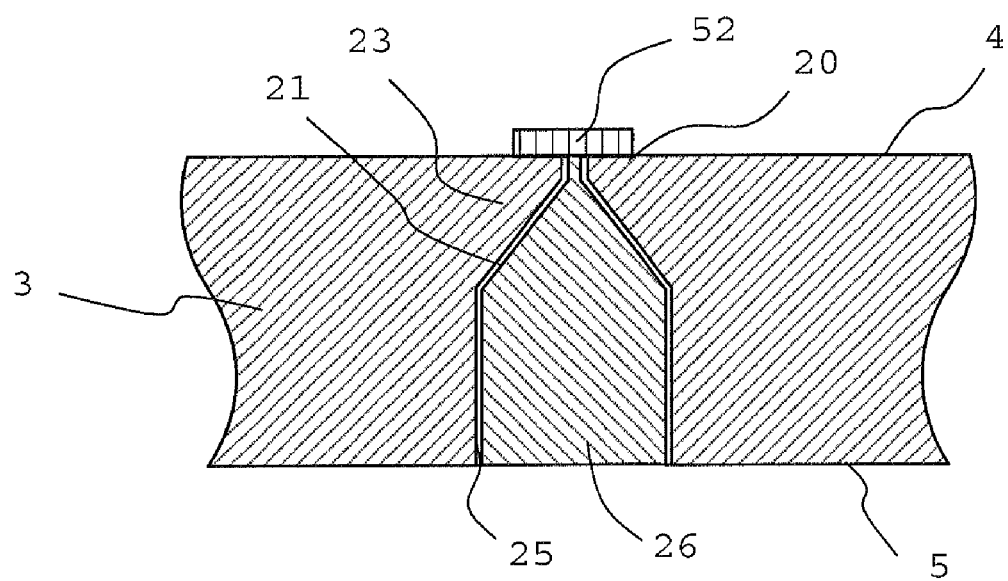

Referring to FIGS. 7e-f, one embodiment of a wafer 3 in accordance with the present invention comprises a first and/or second conductive coating 25, 26 which covers only a portion of the sidewall 11 of the through-wafer via hole 9. This can be accomplished for example by patterning of a resist layer that is deposited onto the sidewall 11 before deposition of the conductive coating 25, 26. FIG. 7e schematically illustrates a through-wafer via hole 9 of a low resistance through wafer via comprising a constriction 23. A first conductive coating 25 covers at least a portion of the upper and lower sloping walls 20,21 of the constriction and a second conductive coating 26 covers the first conductive coating 25 and forms a plug that seals the through-wafer via hole 9 and provides a electrical connection between the upper side and the lower side 4,5 of the wafer 3. This arrangement can be obtained e.g. by depositing first the first conductive coating 25 on the sidewall 11 and then a resist layer that covers the first conductive coating 25, patterning the resist layer to expose the first conductive coating 25 in said portion of the upper and lower sloping walls 20, 21, and depositing the second conductive coating on the exposed portion of the first conductive coating 25. FIG. 7f schematically illustrates one embodiment of an electronic device in accordance with the present invention wherein the constriction 23 is positioned adjacent to the upper side 4 of the wafer 3. In order to contact a component 52 attached to, or integrated in, the upper side 4 of the wafer 3, the first and/or conductive coating 25, 26 extend/extends to said component through a narrow passage formed by the constriction 23. The narrow passage can for example be formed by firstly forming the wider part of the through-wafer via hole 9 from the lower side 5, depositing a resist layer on the sidewall 11 of the through-wafer via hole, patterning the resist layer to open a hole in the resist layer and forming the narrow passage by etching. The first and/or second conductive coating 25, 26 is/are deposited to form an electrical connection from the component on the upper side 4 to the lower side 5. One advantage with this kind of contacting of components over prior art technologies wherein a straight via holes are plated is that the negative influence of voids is prevented.

The wafer material and the conductive coatings given in the description of the above mentioned embodiments are by way of example only. As appreciated by a person skilled in the art other metals or metal alloys such as Cu, Ni, Au, Al etc may be used as conductive coatings, and alternative insulating layer 27 materials are materials such as BCB, Parylene, $Si_3N_4$, etc. However the conductive and the insulating materials are not limited to these materials and combinations of different materials are also possible. Moreover the first conductive coating 25, which is present in the through-wafer via 7, may be used as a seed layer for an electroplated second conductive coating 26. As appreciated by a person skilled in the art many seed layer materials are possible and Ti/Cu, Ti/Ni, Al, etc are examples of such.

From FIG. 7b, it is clear that the constriction 23 functions as an anchorage for the conductive coating of the through-wafer via 7. Thereby the reliability during operation and handling of the device is improved compared with e.g. a via having a vertical sidewall that extends through the whole via. In the latter, mechanical forces arising during handling or use may cause the conductive coating to be withdrawn or pushed out from the via, which is a problem.

In one embodiment of the present invention the wafer 3 comprises a plurality of through-wafer via holes, wherein at least one through-wafer via hole 9 is sealed and at least one through-wafer via hole 9 is open. This feature is desirable in many MEMS systems where vias for both gas transport and electrical connection can be necessary in the same wafer.

FIG. 8 illustrates one embodiment of the present invention wherein the wafer 3 is a SOI wafer having a device layer 38 adjacent to the upper side 4 of the wafer 3 and an insulator layer 39 under the device layer 38. A through-wafer via 7 extends from the upper side 4 to the lower side 5 of the wafer 3. The device layer 38 may be used to form an electronic device comprising for example MEMS structures or microelectronic components.

Referring to FIG. 9a, one embodiment of the present invention comprises integrated components 50, such as e.g. CMOS circuits, in at least the top surface layer of the upper side 4 of the wafer 3. A through-wafer via 7 comprising an insulator layer 27 and at least a first conductive coating 25 according to the present invention extends from the upper side 4 to the lower side 5 of the wafer 3. A passivation layer 53 preferably covers the integrated components 50 and the wafer surface. The through-wafer via 7 may be electrically connected to the integrated component 50. The passivation layer is not necessary, but commonly some kind of passivation layer is desirable. An electronic device according to the present invention may be fabricated starting from a conventional electronic device comprising pre-fabricated integrated components 50, as described below. Then a passivation layer 53 already present on the electronic device can be used to protect the integrated components 50 in the subsequent processing. The passivation layer may also be added before starting the processing or being added before finishing the electronic device.

Referring to FIG. 9b, one embodiment of the wafer 3 according to the present invention comprises integrated components 50 integrated in the wafer 3 surface, such as integrated circuits, and components arranged on the surface of the wafer 3, such as passive components, integrated microelectronic components, MEMS structures, nanostructures, sensors, actuators or the like 52. A through-wafer via 7 comprising an insulator layer 27 and at least a first conductive coating 25 and optionally a second conductive coating 26 extends from the upper side 4 to the lower side 5 of the wafer 3. As illustrated in FIG. 9b, a passivation layer 53 covers the integrated components 50 and the wafer surface. The through-wafer via 7 may be electrically connected to the integrated component 50.

The present invention enables the formation of through-wafer vias 7 in wafers 3 comprising pre-fabricated integrated components 50, such as microelectronic components, MEMS structures, nanostructures, sensors, actuators or the like. By way of example only, the integrated circuits or microelectronic components arranged on the surface of the wafer 3, such as memory circuits, processors, FPGAs and AISICs, may be fabricated or mounted before making the through wafer via 7. Using conventional technology reliable through-wafer vias 7 are not readily made—at least not in devices having thick wafers 3. To be able to make reliable vias using conventional technology, the vias have to be made with large diameters, or narrow vias have to be processed to a limited depth in a thick wafer, followed by a thinning of the wafer to expose the vias. With a via-first method, crack initiations are created, lowering the total yield during fabrication of such a device.

FIG. 10 illustrates one embodiment of the present invention comprising a glass ceramic wafer 3. The glass ceramic is preferably Foturan® or a similar glass ceramic material. Due to the different processing of such an material compared with silicon other geometries of the through-wafer via hole 9 are possible. The first and second portions 13, 14 of the through-wafer via hole 9 are slightly concave and the upper and lower sloping sidewalls 20, 21 are curved. Further, the intersection 22 between the upper and lower sloping sidewalls 20, 21 is smoothly rounded. Using a glass ceramic wafer the maximum radius of the intersection 22 may be larger than for a silicon wafer.

FIG. 11a schematically illustrates one embodiment of the present invention comprising at least two stacked wafers 3.

Each wafer 3 has an upper side 4 and a lower side 5 and at least one through-wafer via hole 9. The upper side 4 of the lower wafer 3a is adjacent to, and faces towards, the lower side of the upper wafer 3b. At least a part of the upper and lower sides 4, 5 of the wafers 3a, 3b and the sidewalls 11 of the through-wafer via holes 9 are covered by a continuous insulating layer 27. The sidewalls 11 of the through-wafer via holes 9 are coated with a first conductive coating 25, such as a metal or metal alloy film accomplished by e.g. physical vapour deposition, and optionally a second conductive coating 26, such as e.g. a plated metal or metal alloy layer, forming a through-wafer via 7 from the upper side 4 to the lower side 5. Furthermore, the through-wafer via holes 9 comprise a first portion 13 with a substantially vertical sidewall 16, a second portion 14 forming a constriction 23 bulging out towards the centreline of through wafer via hole 9, and a third portion 15 with a sidewall 17, which may be essentially vertical but is not limited to this. At least one through-wafer via 7 in the first wafer 3a is aligned to a through wafer via 7 in the second wafer 3b and connected thereto by a joint 61. As illustrated in FIG. 11a, the joint 61 is attached to the second conductive layer 26 of the through-wafer vias 7 and extends into the through-wafer via hole 9. This gives a reliable connection, which is anchored both laterally and vertically. The through-wafer via 7 may also be open or completely filled. As illustrated in FIG. 11b, with an open through-wafer via 7, the joint 61 is allowed to extend beyond the constriction 23 of the through-wafer via 7. Consequently, the vertical anchoring of the joint 61 is improved. The joint 61 may be formed by soldering, welding, plating, gluing—for example with conducting glue, or the like.

Figure 12A:
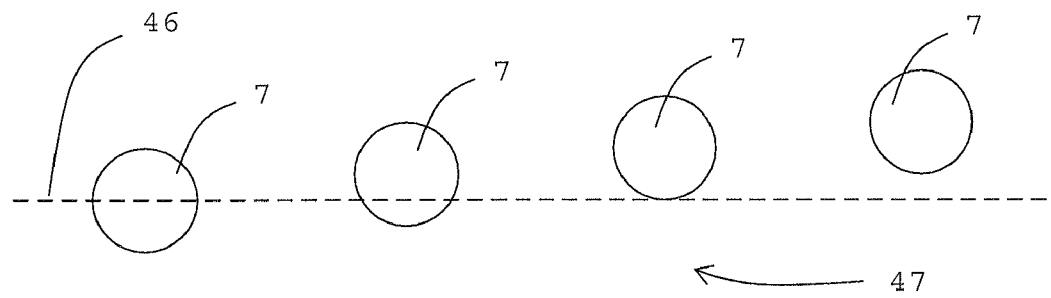
FIG. 12a is a schematic illustration of a via array comprising a first group of through-wafer vias according to the invention.

FIG. 12a schematically illustrates one embodiment of the present invention comprising an array of through-wafer vias 7 according to the invention. At least a first group 47 of successive through-wafer vias 7 extends along a line 46. The through wafer vias 7 are distributed along the line 46 to form the array. Each successive through-wafer via 7 is displaced relative the preceding through-wafer via 7 in a direction perpendicular out from the line 46 in a stepwise manner.

Figure 12B:
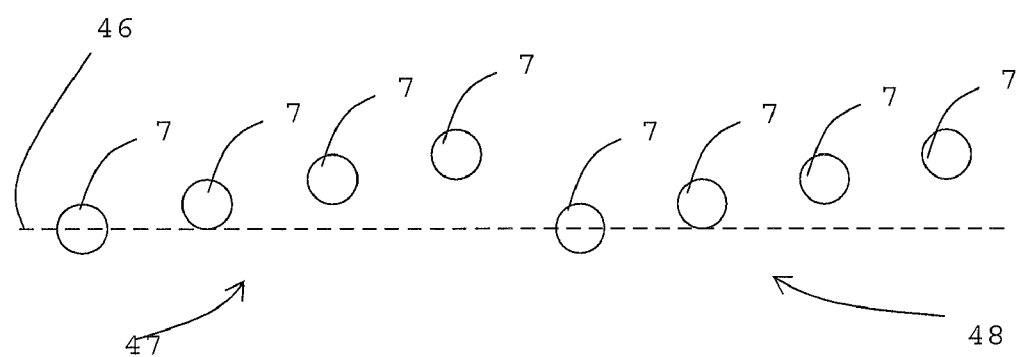
FIG. 12b is a schematic illustration of a via array comprising a two groups of through-wafer vias according to the invention.

FIG. 12b schematically illustrates one embodiment of the present invention comprising an array of through-wafer vias 7. At least a first group and a second group 47, 48 of successive through-wafer vias 7 are arranged in sequence and extending along a line 46 to form the array. Each successive through-wafer via 7 within a group 7, 8 is displaced relative the preceding through-wafer via 7 in a direction perpendicular out from the line 46 in a stepwise manner. Preferably, the distance between the last through-wafer via 7 of the first group 47 and the first through-wafer via 7 of the second group 48 is larger than the perpendicular distance between two successive through-wafer vias 7 within a group 47, 48.

The embodiments described above with reference to FIGS. 12a and 12b improve the reliability of an electronic device which has an array of through-wafer vias 7. Said embodiments are not only useful for through-wafer vias according to the present invention, but also other vias. Commonly through-wafer vias 7 are placed in a straight row. If there is a crack formation due to e.g. an applied load at one through-wafer via the crack will likely propagate from one through-wafer via 7 to another. In particular, if a mono-crystalline wafer such as a Si-wafer is used and the through-wafer vias 7 are placed on a straight row in parallel with any crystal plane of the wafer this is a very likely scenario. To minimize this problem an array of through-wafer vias 7 can be directed in another direction that does not lie along a crystal plane. However, as a person skilled in the art understands, it is often necessary or at least advantageously to have the through-wafer vias 7 placed substantially along a crystal plane. By placing the through wafer vias 7 as described above with reference to FIGS. 12a and 12b crack propagation is impeded since a crack would have to propagate in a direction other than the along the crystal planes, which requires much more energy. Furthermore, the arrangement in FIG. 12b reduces the risk for a crack to propagate along the whole array since there is a long distance between the last through-wafer via 7 of the first group 47 and the first through-wafer via 7 of the second group 48.

Figure 13A:
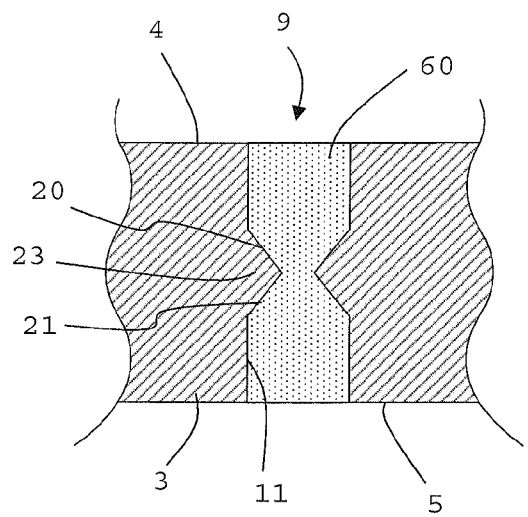
FIG. 13a and FIG. 13b are schematic illustrations of wafers comprising a cooling medium inside the through-wafer via hole according to the present invention, wherein the through-wafer via hole has no conductive coating in FIG. 13a, and has a conductive coating in FIG. 13b.

Referring to FIG. 13a, one embodiment of the present invention is a wafer 3 having an upper side 4 and a lower side 5 and comprising at least one through-wafer via hole 9 extending from the upper side 4 to the lower side. By way of example, the through-wafer via hole 9 comprises a first portion 13 with a substantially vertical sidewall 16, a second portion 14 forming a constriction 23 bulging out in the in the through wafer via hole 9, and a third portion 15 with a substantially vertical sidewall 17. The constriction 23 comprises an upper sloping sidewall 20 widening out towards the upper side and a lower sloping sidewall 21 widening out towards the lower side. The wafer, an electronic device comprising the wafer, or at least a part of the wafer, may in this way be adapted to be cooled by a flow of cooling medium 60 through the through-wafer via hole 9.

Figure 13B:
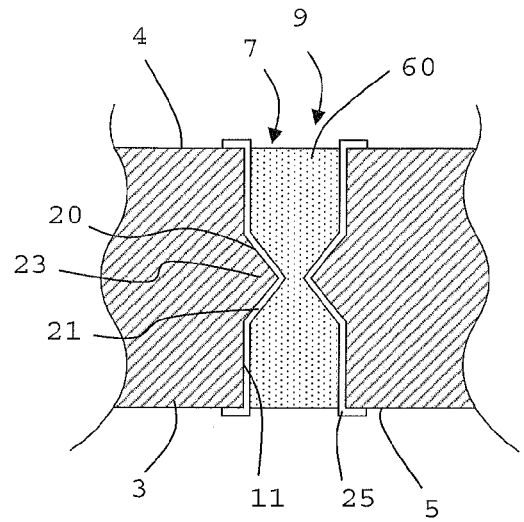

Referring to FIG. 13b, one embodiment of the present invention is a wafer 3 having an upper side 4 and a lower side 5 and comprising at least one through-wafer via hole 9 comprising a constriction 23 according to the present invention. The sidewall 11 of the through-wafer via hole 9 is coated with at least a first conductive coating 25 to form a through-wafer via 7 from the upper side 4 to the lower side 5. By way of example, the through-wafer via hole 9 comprises a first portion 13 with a substantially vertical sidewall 16, a second portion 14 forming the constriction 23 bulging out towards the centreline of the through wafer via hole 9, and a third portion 15 with a substantially vertical sidewall 17. The constriction 23 comprises an upper sloping sidewall 20 widening out towards the upper side and a lower sloping sidewall 21 widening out towards the lower side. The wafer, an electronic device comprising the wafer, or at least a part of the wafer, may in this way be adapted to be cooled by a cooling medium 60 within the through-wafer via hole 9. Preferably the cooling medium 60 flows through the through-wafer via hole 9.

Electronic devices are usually heated, or warm up, during operation. In particular this is the case for high frequency components such as e.g. RF-components. Electronic component integrated in the wafer, integrated on the surface of the wafer, or mounted on the surface of the wafer generate heat which has to be conducted away. Moreover, a through-wafer via may generate a substantial amount of heat, particularly when the through-wafer via conducts high frequency signals. The performance of electronic devices may be improved by cooling of the device. Usually the wafer 3 of an electronic device is used as a heat sink. The heat conduction properties at the sidewall 11 are important for the ability to conduct heat either from the wafer 3 to the through-wafer via or vice versa. A through-wafer via 7 according to the present invention improves the heat conduction properties at the sidewall due to improved contact between the first conductive layer 25 and the wafer 3. The improved contact is a result of advantageous deposition conditions due to the inclined surfaces of the constriction 23.

The cooling of a wafer or an electronic device comprising a through-wafer via hole 9 may be improved by flowing a cooling medium through the through-wafer via hole 9. The cooling medium then absorbs heat and transports the heat away. The heat conduction from the wafer 3 to the cooling medium is limited by a boundary layer formed in the flowing cooling medium at the sidewall 11. The flow velocity at the sidewall 11 is much less than in the middle of the through-wafer via hole 9. However, due to the constriction 23 of the through-wafer via hole 9 according to the present invention the flow velocity of the cooling medium is increased at the constriction. Thereby the boundary layer may be disturbed and the rate of heat conduction increased. This phenomenon can be utilized for cooling in a through-wafer via hole 9 both with and without conductive coatings 25, 26. One example of the latter is for through-wafer vias 7 according to the present invention, wherein high frequency signals such as RF-signals, are conducted through the through-wafer via 7.

Although the embodiments with reference to FIGS. 13a and 13b have been described as having a constriction 23 in the middle of the through-wafer via hole 9, the geometry of the via hole 9 is not limited to this. Any of the open through-wafer via hole configurations of the embodiments described above and modifications thereof can also improve the heat conduction.

Figure 14:
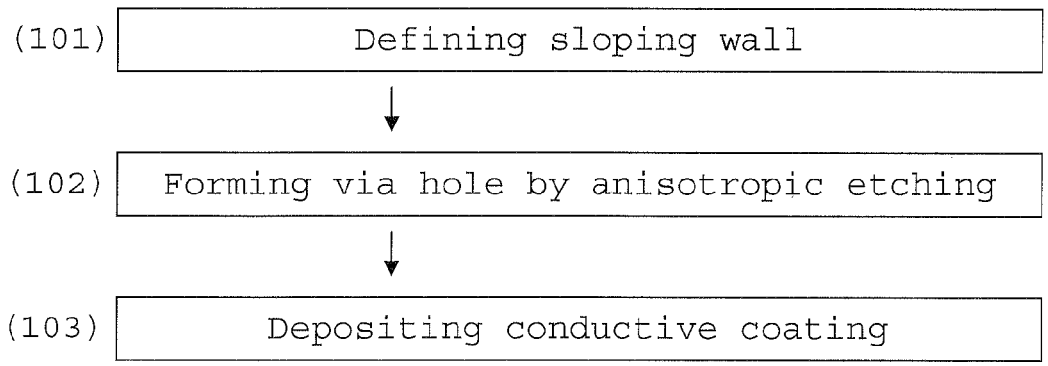
FIG. 14 is a schematic illustration of one embodiment of the method of manufacturing a wafer according to the invention.

Referring to FIG. 14, a method of manufacturing a wafer 3 having a upper side 4 and a lower side 5 and comprising at least one through-wafer via hole 9 having a sidewall 11, wherein the sidewall 11 of the through-wafer via hole 9 is coated with a first conductive coating 25 forming a through-wafer via 7 from the upper side 4 to the lower side 5; and the through-wafer via hole comprises at least a first portion 13 with a substantially vertical sidewall 16 and a second portion 14 defining a constriction 23, the constriction 23 comprising at least an upper sloping sidewall 20 widening out towards the upper side, comprises the steps of:
  101 defining at least one first sloping wall 18 in the wafer 3, the first sloping wall 18 determining the shape of the upper sloping wall 20 of the constriction 23;
  102 forming the through-wafer via hole 9 by anisotropic etching, wherein the upper sloping sidewall 20 of the constriction 23 replicates the first sloping sidewall 18; and
  103 depositing the first conductive coating 25 on the sidewall 11 of the through-wafer via hole 9.

In one embodiment of the method of the present invention the step of defining comprises the step of forming at least one first recess 28 with a first sloping wall 18 on the upper side 4 of the wafer 3 by etching.

Figure 15:
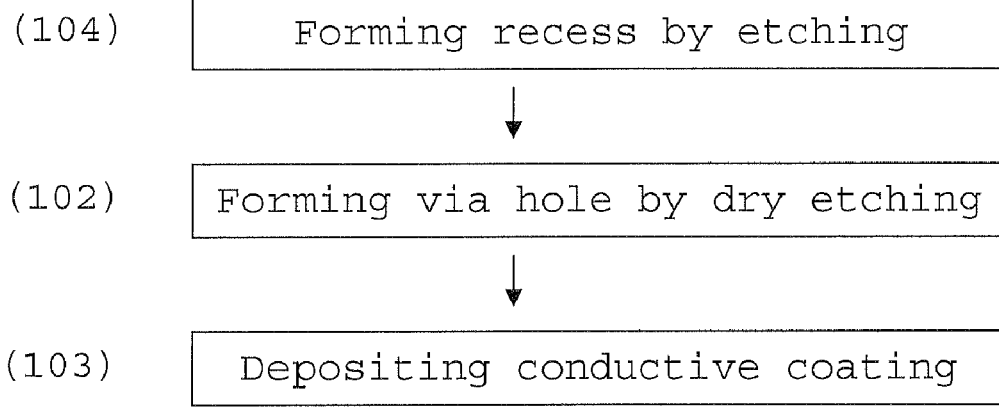
FIG. 15 is a schematic illustration of another embodiment of the method of manufacturing a wafer according to the invention.

Referring to FIG. 15, in one embodiment of the method of the present invention the step of defining comprises the step of 104 forming at least one first recess 28 with a first sloping wall 18 on the upper side 4 of the wafer 3 by etching. Preferably the step of forming by anisotropic etching comprises dry etching.

Figure 16:
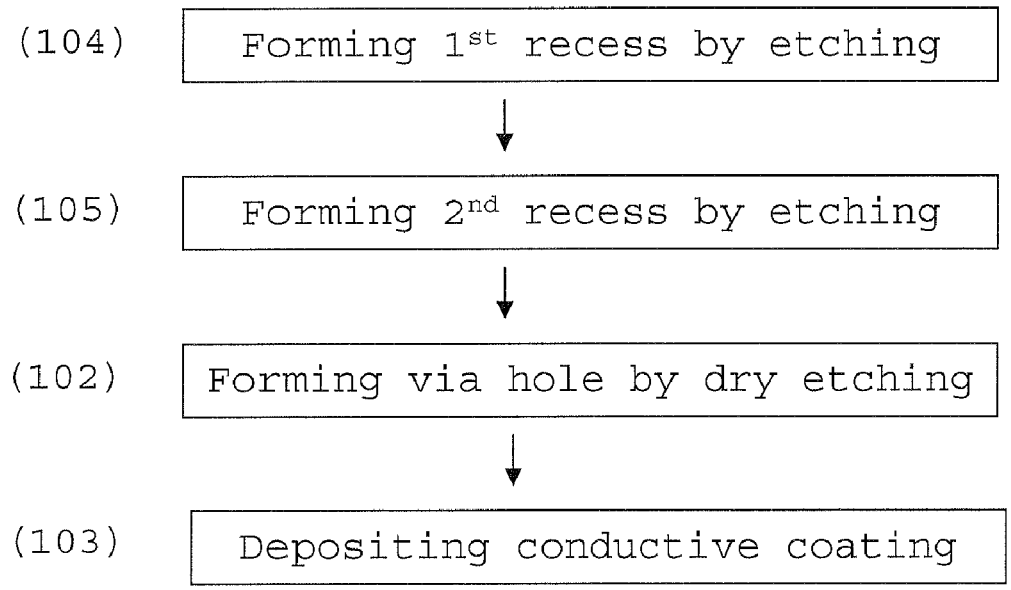
FIG. 16 is a schematic illustration of yet another embodiment of the method of manufacturing a wafer according to the invention.

Referring to FIG. 16, one embodiment of the method of the present invention further comprises the step of 105 forming at least one second recess 29 with a second sloping sidewall 19 on the lower side 5 of the wafer 3 by etching, the second sloping wall 19 determining the shape of a lower sloping wall 21 of the constriction 23 widening out towards the lower side. By way of example the step of forming by anisotropic etching comprises dry etching.

The through-wafer via 7 illustrated in FIG. 1 may be manufactured in a (100) silicon wafer by forming the first recess 28 in the upper side 4 aligned to the second recess 29 in the lower side and with substantially the same dimensions, by e.g. anisotropic wet etching in a KOH-solution. The first and second sloping walls 18, 19 of the first and second recesses 28, 29 are thereby defined by the (111) planes. Subsequently to the wet etching the semiconductor wafer is dry etched within the second recess 29, e.g. using a DRIE process, to form the vertical sidewalls. The shape of the second sloping sidewall 19 is substantially preserved as the hole propagates through the wafer 3 during the dry etching process. Finally the hole reaches the bottom of the first recess 28, forming a via hole 9. The second sloping sidewall 19 is substantially replicated to form the lower sloping sidewall 21 of the constriction 23.

In one embodiment of the present invention the anisotropic etching comprises dry etching from the upper side 4 of the wafer 3. By way of example, the through-wafer via 7 illustrated in FIG. 3 may be accomplished in a 100 silicon wafer by forming the first recess 28 in the upper side 4 aligned to the second recess 29 in the lower side and with substantially the same dimensions, by e.g. anisotropic wet etching in a KOH-solution. Subsequently to the wet etching the semiconductor wafer 3 is dry etched within the first and the second recesses 28, 29, e.g. using a DRIE process. Thereby the first and second sloping sidewalls 18, 19 are substantially replicated to form the upper and lower sloping sidewalls 20, 21 of the constriction 23, respectively. The dry etching may be performed simultaneously from both sides 4, 5 of the wafer or from one side 4, 5 at a time.

After the dry etching step the constriction 23 the intersection 22 between the upper and lower sloping walls 20, 21 becomes relatively sharp. Moreover the dry etch process may leave certain defects on the surface of the sloping walls 20, 21, e.g. so called "grass". In one embodiment of the method of the present invention the method further comprises the step of forming a temporary layer 36, e.g. silicon oxide, on at least the surface of the sidewall 11 of the through-wafer via 7. The formation of the silicon dioxide consumes the silicon of the wafer 3 to a certain depth. Typically 1-3 μm silicon is consumed. By removing the silicon oxide in a wet etch process using a hydrofluoric acid solution the defects are removed since the formation of the oxide layer 36 consumed essentially all the silicon of the defects, and the constriction 23 is thereby smoothened.

The first and second recesses may also be formed using an anisotropic dry etch process, wherein the process is tuned to give a specific inclination of the sloping sidewalls 20, 21.

In one embodiment of the present invention the step of wet etching comprises the step of isotropic etching. The first and second recesses 28, 29 may be formed using e.g. isotropic wet etching or isotropic dry etching. By using an isotropic etch the first and second sloping sidewalls 18, 19 becomes concavely curved and hence the upper and lower sloping sidewalls 20, 21 are replicated to the same shape in the subsequent dry etch process.

The first conductive coating 25 may be deposited using a physical vapour deposition (PVD) process such as sputtering or evaporation. Due to the controlled shape of the constriction 23 of the present invention the coverage of the conductive coating 25, 26 is complete despite such an line-of-sight process being used.

In one embodiment of the method of the present invention the step of depositing further comprises the step of depositing a second conductive coating 26 onto the first conductive coating 25. The second conductive coating 26 is deposited using plating, either electroplating or electro-less plating, of a metal or metal alloy, e.g. Cu, Al, Ni, Au, Ag etc., with the first conductive coating 25 serving as a seed layer. In this case the first conductive coating 25 is preferably deposited using a wet chemical processes or electroless plating. The thickness of the plated layer 26 may be chosen to be up to a thickness when the through-wafer via hole 9 is closed by the plated metal or metal alloy 26, as illustrated in FIG. 7b. The first conductive coating 25 may be selected from the group of Ti/Cu, Ti/Au, Ti/Ni, Cr/Cu, Cr/Au, Cr/Ni, Pd/Ni, Pd/Ag, Ti/Ag, but it is not limited to these materials.

One embodiment of the method of the present invention further comprises the step of depositing an insulating layer 36 at least on the sidewalls 11 of the through-wafer via hole 9 before depositing the first conductive coating 25. Instead of depositing an insulating layer, the insulating layer may be formed by a thermal process wherein the silicon on the surface partly is transformed to e.g. $SiO_2$ or $Si_3N_4$.

In one embodiment of the method of manufacturing a wafer in accordance with the present invention the starting wafer comprises pre-fabricated components such as integrated microelectronic components, MEMS-structures or nanostructures, i.e. the starting wafer is actually an electronic device. As described above, the integrated microelectronic components 50 may be e.g. CMOS circuits at least partly buried in the surface of the wafer 3, or thin film deposited microelectronic components, such as memory circuits on the surface of the wafer. In conventional technology through-wafer vias are made either before or after the fabrication of the components of the electronic device. When made before the components the through-wafer via must withstand the typical high temperature processes of the fabrication of the components, which excludes the use of high conductivity materials such as metals in the through-wafer vias. Therefore such through-wafer vias have a relatively high resistance. On the other hand, when making the through-wafer vias on wafers comprising pre-fabricated components the reliability and yield of the through-wafer via processing is crucial. Conventional processes result in vias with unsatisfactory coverage of the conductive coating 25 in the through-wafer via, too large vias, liability to crack, or requirement of wafer thinning processes. The present invention allows the processing of high yield, through-wafer vias on wafers comprising pre-fabricated components. Furthermore wafer thinning is avoided.

In one embodiment of the method of the present invention a through-wafer via 7 is formed in a wafer 3 comprising pre-fabricated components, exemplified by CMOS circuits 50 on the lower side 5 of the wafer 3. First a first recess 28 is formed in the lower side 5 by dry etching to define a first sloping wall 18. Next anisotropic dry etching is used to form a through-wafer via hole 9. Thereby a constriction 23 is formed and the upper sloping sidewall 20 of the constriction 23 replicates the first sloping sidewall 18. The sidewall 11 of the through-wafer via hole 9 is preferably coated with an insulating layer to provide electrical insulation. Subsequently the through-wafer via hole 9 is coated with at least a first conductive coating 25. In another embodiment, wet etching, e.g. anisotropic KOH-etching, is used to form the first recess 28 before the anisotropic dry etching of the through-wafer via hole 9. This requires a passivation layer 53 on the components to protect them from the aggressive etchant. Commonly the wafers comprising pre-fabricated components are protected with a passivation layer, which is suitable for the through-wafer via hole processing. Otherwise, a passivation layer has to be deposited before further processing. Although these embodiments describe etching from only the upper side 4, it should be understood that any through-wafer via 7 according to the present invention can be formed in a wafer comprising pre-fabricated components.

Figure 17A:
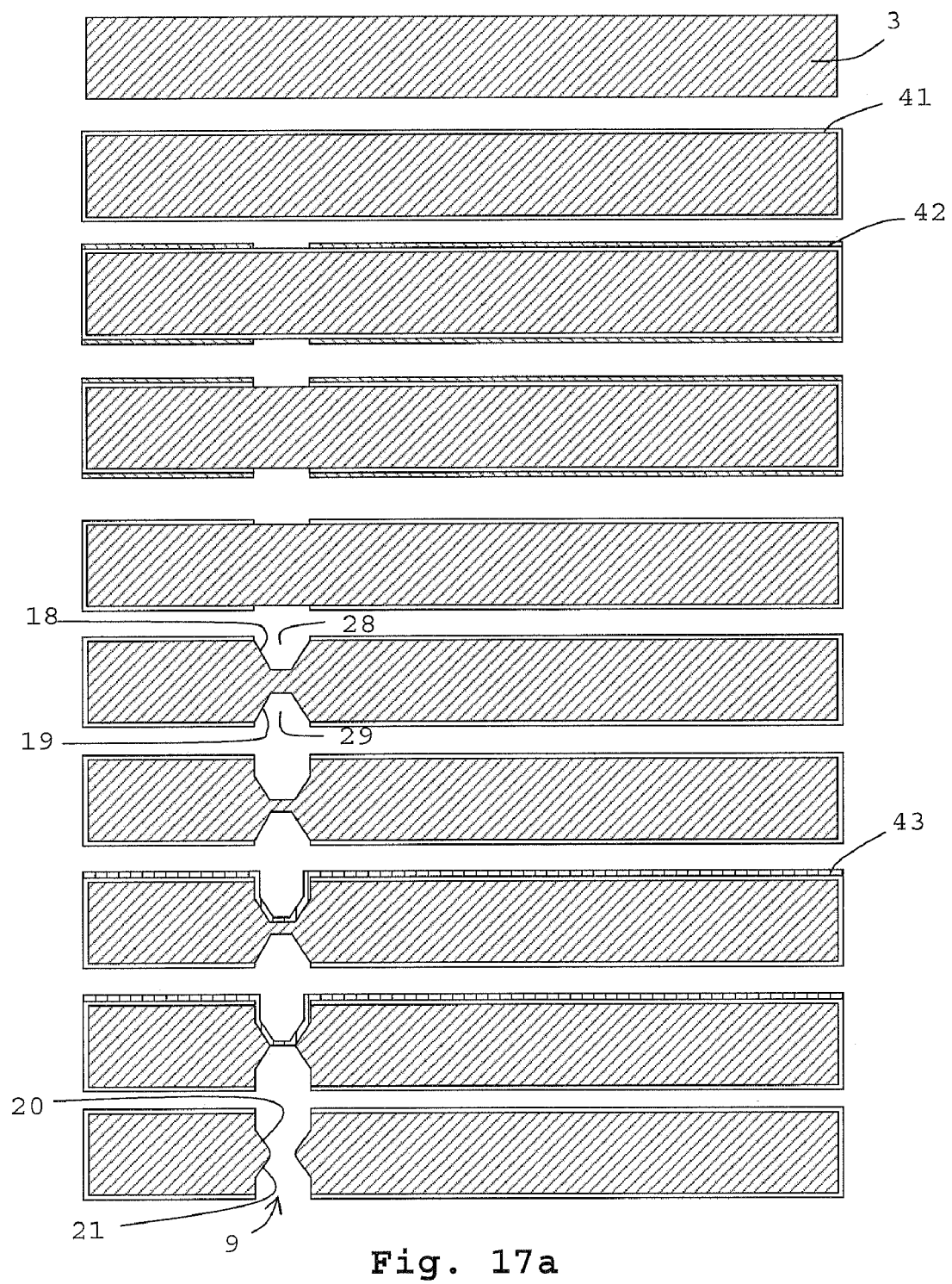
FIGS. 17a and 17b is a schematic illustration of one example of manufacturing a semiconductor wafer according to the invention.
Figure 17B:
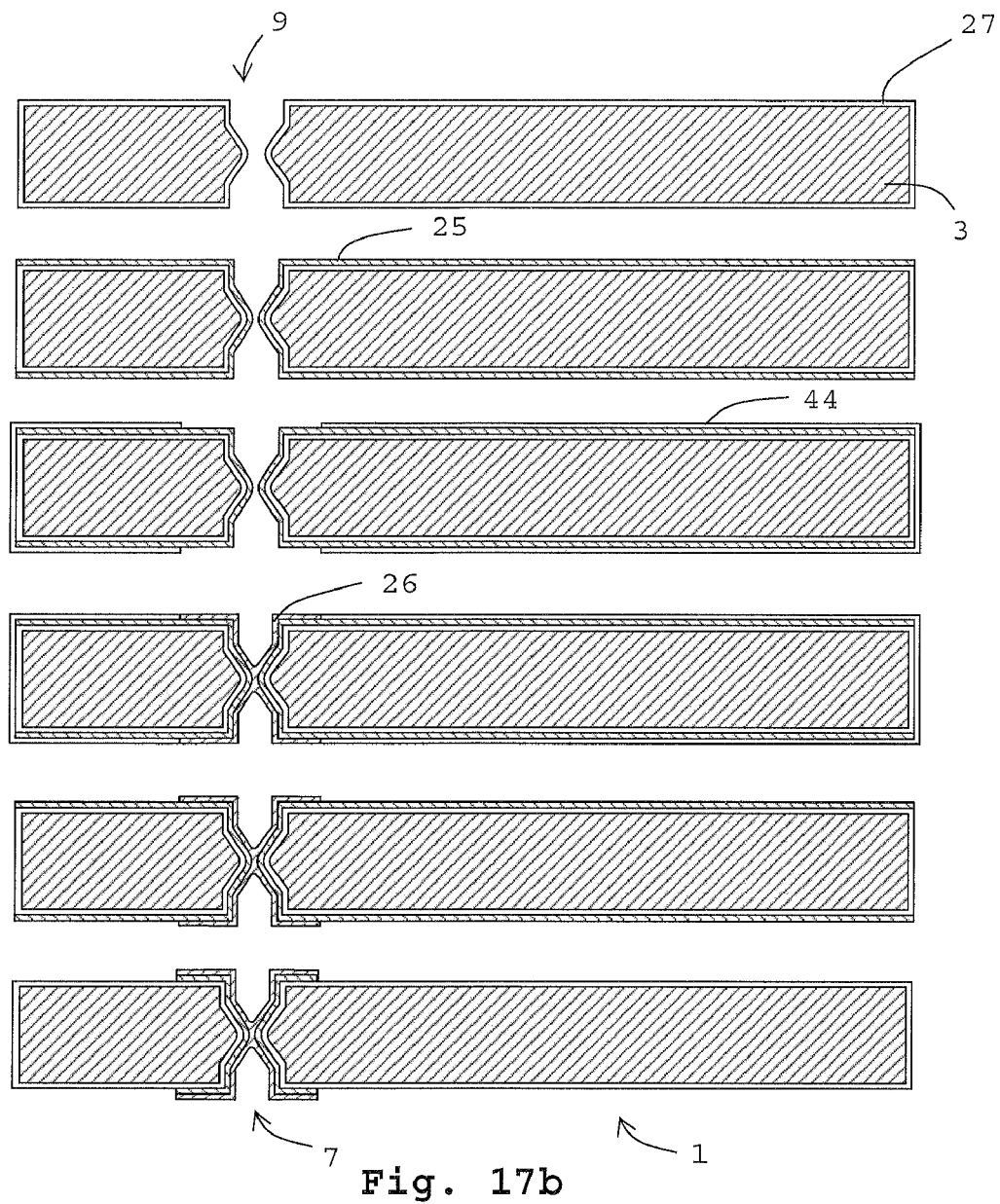

One example of the method of the present invention is illustrated in FIGS. 17a and 17b. A 525 μm thick silicon 100 wafer 3 is used as starting material. As appreciated by a person skilled in the art the wafer may have been processed before this step to form structures or components in the wafer. The processing comprises the steps of:
- forming a silicon oxide layer 41 covering at least the upper and lower sides 4, 5 of the wafer 3;
- depositing and patterning a resist layer 42 by conventional photolithography to form a masking layer with openings in the position of the future through-wafer via hole 9;
- removing the unmasked silicon oxide 41 using a standard wet etch process, e.g. by using a BHF solution;
- stripping the resist 42 by standard methods;
- forming the first and second recesses 28, 29 on the upper and lower sides 4, 5, respectively, using a KOH (anisotropic crystal plane dependent wet etch);
- forming the first portion 13 and partly the third portion 15 of the through-wafer via hole 9 by DRIE etching;
- depositing a Al layer 43 on the upper side 4 of the wafer using sputtering;
- forming the remaining part of the third portion 15 of the through-wafer via hole 9 by DRIE etching, the Al layer 43 being functional as a etch stop layer;
- stripping the Al layer 43 on the upper side by a standard process;
- removing the silicon oxide 41 and forming a new silicon oxide layer 27 covering at least the upper and lower sides 4, 5 of the wafer 3 and the sidewall 11 of the through-wafer via hole 9;
- depositing a first conductive coating 25, i.e. a seed layer made of Ti/Cu, covering the oxide layer;
- depositing a resist layer 44, which is patterned to leave openings in the resist layer 44 around the through-wafer via holes 9;
- depositing a second conductive coating 26 made of Cu by electroplating;
- removing the resist 44 by a standard process; and
- removing the exposed seed layer 25 using a standard process.

Figure 18:
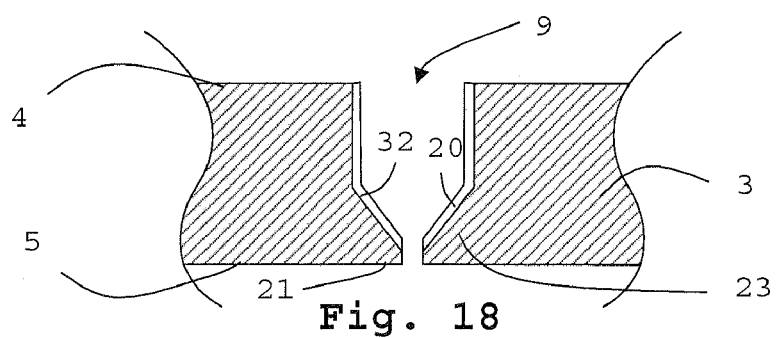
FIG. 18 schematically illustrates a through-wafer via hole formed using a patterned resist layer as mask.

Referring to FIG. 18, one embodiment of a method according to the present invention comprises the steps of:
- defining at least one first sloping wall 18 in the wafer 3, the first sloping wall 18 determining the shape of the upper sloping wall 20 of the constriction 23;
- forming partly the through-wafer via hole 9 by anisotropic etching, wherein the upper sloping sidewall 20 of the constriction 23 replicates the first sloping sidewall 18;
- depositing a resist layer 32 on the sidewall 11 of the through-wafer via hole 9;
- patterning the resist layer 32 by photolithography and developing to remove a portion of the resist layer 32 in the centre of the through-wafer via hole 9; and
- etching the remaining part of the through-wafer via hole 9 with the resist layer as mask.

This procedure also can be used when a component is on the lower side 5 of the wafer 3. This may require that some kind of protection is applied to the lower side of the wafer. The patterning of the resist layer 32 can be made with high accuracy and hence an electrical connection from the upper side to the component can be accomplished with high accuracy.

Figure 19:
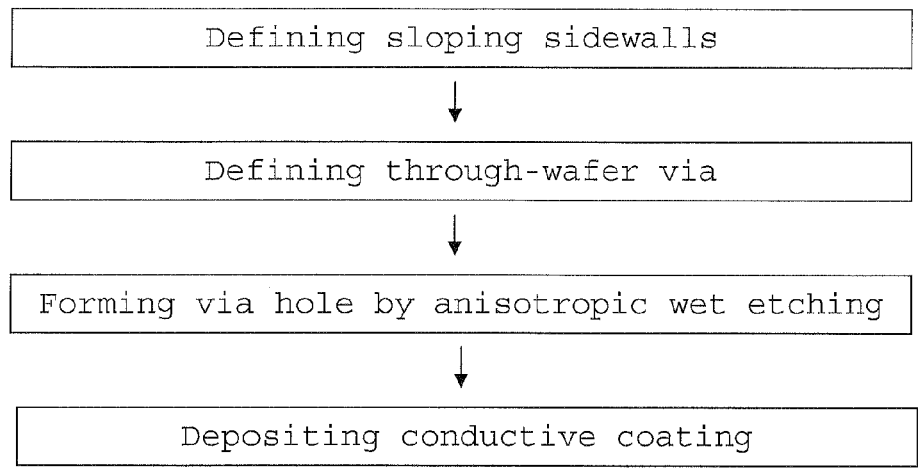
FIG. 19 is a schematic illustration of one embodiment of the method of manufacturing a glass ceramic wafer according to the invention.

Patterning of a resist layer can also be used to define where the conductive coating 25, 26 is applied. Moreover patterning of a resist layer can be used also to pattern other layers that are deposited on the sidewall of the through-wafer via hole 9. These layers may comprise PECVD (plasma enhanced chemical vapour deposition) $SiO_2$, BCB or Parylene. As appreciated by one skilled in the art, the resist can be deposited using different methods, i.e. spin-on resist, spray-on resist and electrodeposited resist etc. can be used. FIG. 19 is a schematic diagram of one embodiment of the method of the present invention wherein the method comprises the steps of:

defining at least one first sloping wall 18 in the wafer 3, the first sloping wall 18 determining the shape of the upper sloping wall 20 of the constriction 23;

defining the remaining part of the sidewall (11) of the through wafer via hole (9).

forming the through-wafer via hole 9 by anisotropic etching, wherein the upper sloping sidewall 20 of the constriction 23 replicates the first sloping sidewall 18; and depositing the first conductive coating 25 on the sidewall 11 of the through-wafer via hole 9.

In one embodiment of the invention the method further comprises the step of defining at least one second sloping wall (19) in the wafer (3), the second sloping wall (19) determining the shape of the lower sloping wall (21) of the constriction (23).

Figure 20:
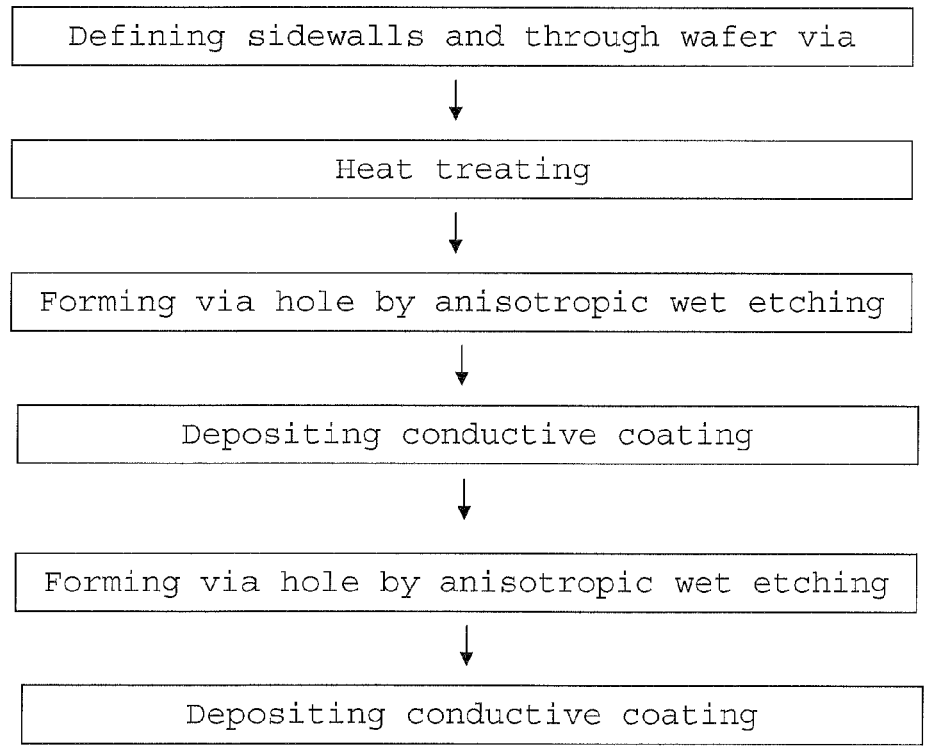
FIG. 20 is a schematic illustration of another embodiment of the method of manufacturing a glass ceramic wafer according to the invention.

Referring to FIG. 20, a wafer 3 having a shape according to FIG. 3 is manufactured using a photosensitive starting material, e.g. Foturan® or other so called glass ceramics. According to the present invention a light beam having a certain wavelength, e.g. about 290-330 nm for Foturan®, is scanned over the material to define the upper and lower sloping sidewalls 20, 21, a smoothened intersection 22 between the upper and lower sloping sidewalls 20, 21, and the remaining part of the sidewall 11, i.e. to define the geometry of the through-wafer via hole 9. The exposed material changes its properties so that a subsequent heat treatment makes the wafer material crystallize in the exposed regions. In Foturan® silver atoms are formed in the exposed regions and during the heat treatment between 500° C. and 600° C. the glass crystallizes around these silver atoms. The material in the exposed regions, i.e. within the through-wafer via hole, is then removed by anisotropic etching using a hydrofluoric acid solution. The crystalline regions, when etched with a 10% solution of hydrofluoric acid at room temperature, have an etching rate up to 20 times higher than that of the vitreous regions.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A wafer comprising a through-wafer via from an upper side to a lower side of the wafer,
   wherein the through-wafer via comprises a through-wafer via hole having a sidewall at least partly covered with a first conductive coating,
   wherein the through-wafer via hole comprises at least a first portion with a substantially vertical sidewall and a second portion that forms a constriction with at least an upper sloping sidewall widening out towards an upper side in the through-wafer via hole, and
   wherein the second portion is arranged in between the first portion and a third portion of the sidewall, the third portion having a substantially vertical sidewall.

2. The wafer according to claim 1, wherein the constriction further comprises a lower sloping sidewall widening out towards a lower side in the through-wafer via hole.

3. The wafer according to claim 2, wherein an intersection of the upper and lower sloping sidewalls of the constriction is smoothly rounded.

4. The wafer according to claim 1, wherein the wafer comprises a crystalline semiconductor material.

5. The wafer according to claim 1, wherein the wafer is made of glass ceramic.

6. The wafer according to claim 1, wherein a second conductive coating at least partly covers the first conductive coating.

7. The wafer according to claim 1, wherein the wafer further comprises a plurality of through-wafer vias, wherein at least one through-wafer via is sealed and at least one through-wafer via is open.

8. The wafer according to claim 1, wherein the wafer further comprises at least two groups of through-wafer vias arranged in sequence along a line, with each through-wafer via within each group displaced away from the line relative to a preceding through-wafer via in a stepwise manner.

9. An electronic device comprising a wafer according to claim 1.

10. The electronic device according to claim 9, wherein the electronic device comprises a stack of wafers, each wafer comprising a through-wafer via configured to connect to a through-wafer via of an adjacent wafer.

11. A method for manufacturing a wafer comprising a through-wafer via extending from an upper side to a lower side of the wafer, wherein the through-wafer via comprises a through-wafer via hole having a sidewall at least partly covered with a first conductive coating, wherein the through-wafer via hole comprises at least a first portion with a substantially vertical sidewall and a second portion forms a constriction with at least an upper sloping sidewall widening out towards an upper side in the through-wafer via hole, and wherein the second portion is arranged in between the portion a third portion of the sidewall, the third portion having a substantially vertical sidewall, the method comprising the steps of:

defining at least a first sloping sidewall in the wafer;

forming the through-wafer via hole, wherein the upper sloping sidewall of the constriction replicates the first sloping sidewall; and depositing at least the first conductive coating on the sidewall of the through-wafer via hole.

12. The method according to claim 11, further comprising a step of defining a second sloping sidewall in the wafer, wherein, in the step of forming the through-wafer via hole, a lower sloping sidewall of the constriction replicates the second sloping sidewall.

13. The method according to claim 11, wherein the step of forming the through-wafer via hole comprises anisotropic etching.

14. The method according to claim 11, wherein the step of defining at least the first sloping sidewall comprises forming a first recess comprising the first sloping sidewall on the upper side of the wafer by etching.

15. The method according to claim 12, wherein the step of defining the second sloping sidewall comprises forming a second recess comprising the second sloping sidewall on the lower side of the wafer by etching.

16. The method according to 11, wherein the step of forming the through-wafer via hole comprises two-way etching from the upper and lower sides to form the third portion of the through-wafer via hole having a substantially vertical sidewall.

17. The method according to claim 11, wherein the step of defining at least the first sloping sidewall further comprises defining a second sloping sidewall in the sidewall of the through-wafer via hole, wherein, in the step of forming the through-wafer via hole, a lower sloping sidewall of the constriction replicates the second sloping sidewall.

18. The method according to claim 11, wherein the step of defining at least the first sloping sidewall comprises exposing the wafer to light in a region corresponding to the through-wafer via hole and the step of forming the through-wafer via hole comprises etching an exposed region.

19. The method according to claim 11, further comprising a step of depositing a second conductive coating on the first conductive coating.

* * * * *